(12) United States Patent
How

(10) Patent No.: US 10,079,162 B1
(45) Date of Patent: *Sep. 18, 2018

(54) METHOD FOR MAKING LEAD FRAMES FOR INTEGRATED CIRCUIT PACKAGES

(71) Applicant: TEXAS INSTRUMENTS INCORPORATED, Dallas, TX (US)

(72) Inventor: You Chye How, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/955,435

(22) Filed: Apr. 17, 2018

Related U.S. Application Data

(63) Continuation of application No. 15/452,026, filed on Mar. 7, 2017, now Pat. No. 9,978,613.

(51) Int. Cl.
| | |
|---|---|
| *H01L 21/60* | (2006.01) |
| *H01L 21/56* | (2006.01) |
| *H01L 25/00* | (2006.01) |
| *H01L 21/683* | (2006.01) |
| *H01L 21/48* | (2006.01) |
| *H01L 21/78* | (2006.01) |
| *H01L 25/16* | (2006.01) |
| *H01L 23/495* | (2006.01) |
| *H01L 23/498* | (2006.01) |

(52) U.S. Cl.
CPC ........ *H01L 21/561* (2013.01); *H01L 21/4853* (2013.01); *H01L 21/565* (2013.01); *H01L 21/6836* (2013.01); *H01L 21/78* (2013.01); *H01L 25/165* (2013.01); *H01L 25/50* (2013.01); *H01L 21/4875* (2013.01); *H01L 23/498* (2013.01); *H01L 23/49503* (2013.01); *H01L 2221/68372* (2013.01)

(58) Field of Classification Search
CPC .......... H01L 21/4875; H01L 23/49503; H01L 23/498
USPC .......... 438/110–113, 123, 124; 29/827, 830, 29/842, 855, 856; 257/666–677
See application file for complete search history.

(56) References Cited

U.S. PATENT DOCUMENTS

| | | | |
|---|---|---|---|
| 4,012,765 A | 3/1977 | Lehner et al. | |
| 4,346,396 A | 8/1982 | Carroll, II et al. | |
| 5,070,602 A | 12/1991 | Kaufman et al. | |
| 5,440,452 A | 8/1995 | Kitahara | |
| 5,528,078 A | 6/1996 | Shin | |
| 5,753,532 A | 5/1998 | Sim | |
| 5,900,676 A | 5/1999 | Kweon et al. | |
| 6,247,229 B1 | 6/2001 | Glenn | |
| 6,664,615 B1 | 12/2003 | Bayan et al. | |

(Continued)

*Primary Examiner* — Victoria K Hall
(74) *Attorney, Agent, or Firm* — Rose Alyssa Keagy; Charles A. Brill; Frank D. Cimino

(57) ABSTRACT

Disclosed examples include a method of making a semiconductor die package comprising arranging at least one preformed die attach pad and at least two preformed leads on a lead frame carrier in a predetermined configuration to form a lead frame, attaching a semiconductor die to the at least one preformed die attach pad, wire bonding the semiconductor die to the at least two preformed leads, forming a molding structure including at least part of the semiconductor die and the at least two preformed leads, and removing the molding structure from the lead frame carrier.

19 Claims, 7 Drawing Sheets

(56) References Cited

U.S. PATENT DOCUMENTS

| | | | |
|---|---|---|---|
| 6,740,961 B1* | 5/2004 | Mostafazadeh | H01L 21/4832 257/666 |
| 6,794,224 B2* | 9/2004 | Akram | H01L 21/56 257/E21.502 |
| 6,838,315 B2 | 1/2005 | Danno et al. | |
| 6,888,228 B1 | 5/2005 | Mostafazadeh et al. | |
| 6,900,676 B1 | 5/2005 | Tamura | |
| 7,214,326 B1 | 5/2007 | Yang et al. | |
| 7,314,820 B2 | 1/2008 | Lin et al. | |
| 7,582,954 B1 | 9/2009 | Lim et al. | |
| 8,217,281 B2 | 7/2012 | Van Gemert et al. | |
| 8,330,270 B1 | 12/2012 | Lin et al. | |
| 9,202,778 B2 | 12/2015 | How et al. | |
| 2004/0058478 A1 | 3/2004 | Islam et al. | |
| 2005/0218499 A1 | 10/2005 | Chang et al. | |
| 2005/0266616 A1 | 12/2005 | Weng et al. | |
| 2006/0197199 A1 | 9/2006 | Lange | |
| 2006/0234421 A1 | 10/2006 | Lo et al. | |
| 2008/0290487 A1 | 11/2008 | Zhao et al. | |
| 2009/0121330 A1 | 5/2009 | Cruz | |
| 2009/0267214 A1 | 10/2009 | Kumazawa et al. | |
| 2010/0120201 A1 | 5/2010 | Lin et al. | |
| 2011/0147931 A1 | 6/2011 | Nondhasitthichai et al. | |
| 2011/0291252 A1 | 12/2011 | Hosseini | |
| 2012/0313231 A1 | 12/2012 | Lim et al. | |
| 2013/0015566 A1 | 1/2013 | Gong et al. | |
| 2013/0037927 A1 | 2/2013 | Rogren | |
| 2013/0056861 A1 | 3/2013 | Gao et al. | |
| 2013/0280866 A1 | 10/2013 | Nondhasitthichai et al. | |
| 2013/0344657 A1 | 12/2013 | Wu | |
| 2014/0070391 A1* | 3/2014 | Rogren | H01L 21/77 257/676 |
| 2015/0035130 A1 | 2/2015 | How | |
| 2015/0053586 A1 | 2/2015 | How et al. | |
| 2015/0054145 A1 | 2/2015 | How et al. | |
| 2015/0243639 A1 | 8/2015 | How et al. | |
| 2015/0348879 A1 | 12/2015 | Talledo | |
| 2016/0071743 A1 | 3/2016 | How et al. | |
| 2016/0133599 A1 | 5/2016 | Okamoto | |
| 2016/0240390 A1 | 8/2016 | Eugene Lee et al. | |
| 2018/0047588 A1* | 2/2018 | Rogren | H01L 21/4821 |

* cited by examiner

METHOD FOR MAKING LEAD FRAMES FOR INTEGRATED CIRCUIT PACKAGES

CROSS-REFERENCE TO RELATED APPLICATION

This application is a Continuation of and claims priority to U.S. application Ser. No. 15/452,026 filed Mar. 7, 2017, now U.S. Pat. No. 9,978,613 that issued May 22, 2018, the contents of which is herein incorporated by reference.

BACKGROUND

Integrated circuit devices generally include an integrated circuit chip and a lead frame which are sealed within a protective enclosure, find wide use in various products, among which are consumer electronics, computers, automobiles, telecommunications and military applications. The lead frame electrically interconnects the integrated circuit chip to circuitry external to the device. The lead frame is typically formed from a highly electrically and thermally conductive material, such as copper or copper alloys. The lead frame material is stamped or etched into a plurality of leads, and a central area, called a die attach pad, onto which the integrated circuit chip is attached. The chip is electrically connected to the leads, usually by wire bonding, and the device is encapsulated to provide mechanical and environmental protection.

Conventional lead frames for integrated circuit packages are typically made using metal etching processes to create die attach pads and leads from a conductive layer of material on a bulk substrate or other material. Such process involves etching the conductive layer of material to form discrete conductor structures (e.g., the die attach pads and the leads). The etching process typically limits the spacing between the die attach pads and/or between adjacent leads on these conventional lead frames to at least one thickness of the conductive layer of material due to physical limitations of etching technology. In addition, the portions of the conductive layer removed from the substrate during the etching process generate waste in the manufacturing process. Manufacturer lead times for producing a new lead frame configuration via etching or other processes also can be substantial.

SUMMARY

The present disclosure sets forth a method of making lead frames that utilizes nearly all of the conductor material (incoming raw material for the lead frame conductor structures) and produces lead frames with conductor structures (and/or other types of structures) having a spacing of less than one conductive layer thickness. The method of the present disclosure also affords rapid generation of new lead frame configurations without the need to retool and can result in reduced manufacturer lead times. In one embodiment, preformed die attach pads and preformed leads are arranged on a lead frame carrier to form at least one lead frame. A semiconductor die is then mounted to the die attach pad, wire bonded to the leads, molded and singulated to produce a semiconductor package.

Disclosed example methods include singulating a plurality of conductive structures from a sheet of conductive material, arranging the plurality of singulated conductive structures on a lead frame carrier in a predetermined configuration, and arranging at least one die attach pad on the lead frame carrier to form at least one lead frame having the at least one die attach pad and a plurality of leads spaced apart from the at least one die attach pad. In one example, the conductive structures include a first group of conductive structures having a first metal composition, size, shape or thickness and a second group of conductive structures having a second metal composition, size, shape, or thickness, and the arranging the plurality of structures on a lead frame carrier in a predetermined configuration to form at least one lead frame includes using at least one conductive structure from each group in the at least one lead frame. The arranging the plurality of singulated conductive structures on a lead frame carrier can include using a stencil, wherein the stencil includes openings in locations corresponding to the predetermined configuration, and wherein the stencil is applied over the lead frame carrier and the singulated conductive structures are placed on the lead frame carrier through the openings in the stencil. In another example, pick-and-piece machinery is used to arrange preformed die attach pads and preformed leads on the lead frame carrier.

Another example method of making a semiconductor die package comprises arranging at least one preformed die attach pad and at least two preformed leads on a lead frame carrier in a predetermined configuration to form a lead frame, attaching a semiconductor die to the at least one preformed die attach pad, wire bonding the semiconductor die to the at least two preformed leads, forming a molding structure including at least part of the semiconductor die and the at least two preformed leads, and removing the molding structure from the lead frame carrier.

Still another example method of making a semiconductor die package comprises singulating a plurality of conductive structures from one or more sheets of conductive material, the conductive structures including at least one die attach pad and at least one lead, arranging the at least one die attach pad and at least one lead on a lead frame carrier in a predetermined configuration to form at least one lead frame, attaching a semiconductor die to the at least one die attach pad, wire bonding the semiconductor die to the at least one lead frame, applying molding over the semiconductor die and lead frame, and removing the molded semiconductor die and lead frame from the lead frame carrier.

DETAILED DESCRIPTION

Figure 1:
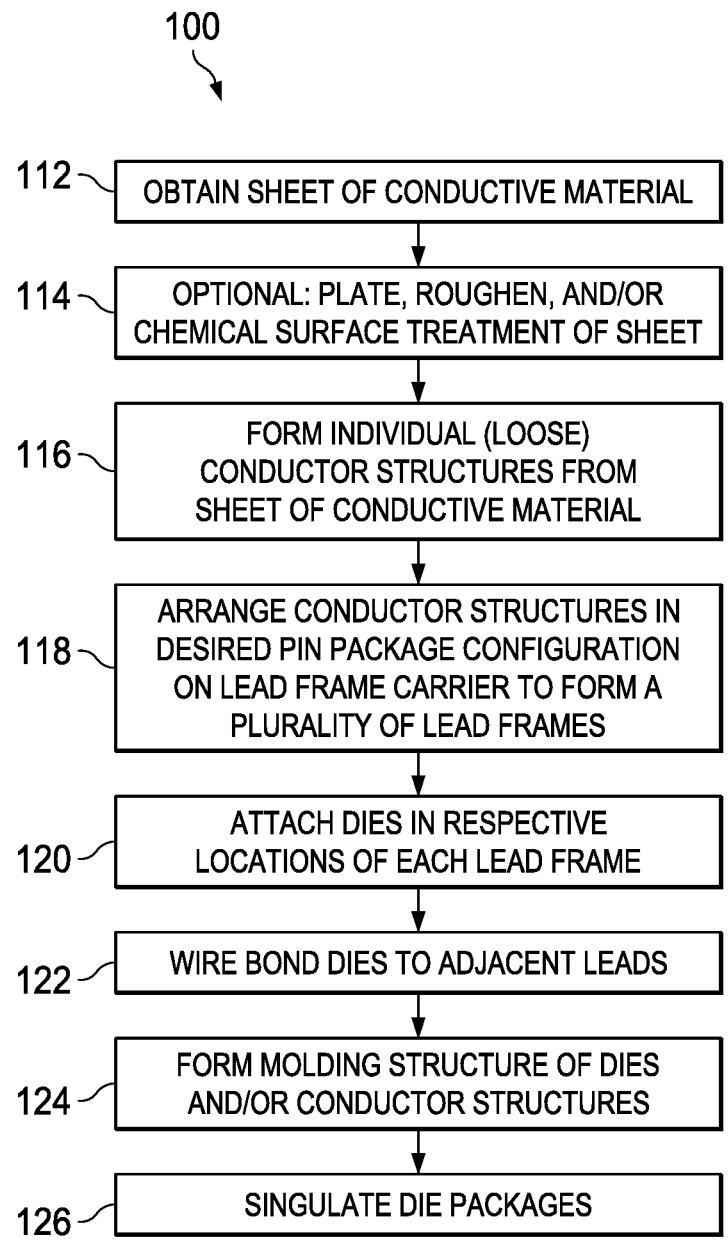
FIG. 1 is a flow diagram showing an example method of fabricating semiconductor chip package according to one embodiment.

In the drawings, like reference numerals refer to like elements throughout, and the various features are not necessarily drawn to scale. In the following discussion and in the claims, the terms "Including", "includes", "having", "has", "with", or variants thereof are intended to be inclusive in a manner similar to the term "comprising", and thus should be interpreted to mean "Including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Referring initially to FIG. 1, an example method 100 for making a semiconductor die package in accordance with the present disclosure is illustrated. The example semiconductor die package in the illustrated embodiment is a quad flat no-lead package (QFN package), but aspects of the present disclosure are applicable to other types of packages.

The method begins with process step 112, where a sheet of conductive material is obtained. The conductive material can be, for example, copper, aluminum, or any other suitable conductive material. In one example, the sheet of conductive material includes a copper layer pre-plated with NiPdAu. As will be appreciated, the sheet of material can be pre-plated with any desired plating material or plating stack of materials to ensure proper bonding of components during downstream processing. In addition, in process step 114 the sheet of material can optionally be plated with various other conductive metals (e.g., NiPdAu), for example, and/or roughened or undergo chemical surface treatment to enhance mold adhesion in later processing steps.

In process step 116, individual conductor structures are singulated from the sheet of material. The individual conductor structures can be, for example, preformed die attach pads and/or preformed leads. Singulation of the individual structures can be performed in any suitable manner such as by sawing, etching, laser cutting, or other singulation processes. As will be appreciated, singulation of preformed die attach pads and/or leads from a sheet of material generally facilitates almost 100% utilization of the sheet of material. Further, and as will be described in more detail in connection with FIG. 3, the singulation step or steps can be used to mill or otherwise create a mold-lock feature, such as a stepped edge or other profile, to enhance integration when the lead frame is molded over.

In process step 118, the singulated conductor structures are arranged or otherwise placed on a lead frame carrier in a predetermined configuration to generate a plurality of lead frames. In this description, a lead frame generally includes at least one die attach pad and a plurality of leads arranged in proximity to the die attach pad. Of course, aspects of the present disclosure can be used to make a variety of structures in addition to lead frames, and the method of the present disclosure is, therefore, not limited to any particular lead frame (or other) structure.

As will be described in more detail below, positioning of the singulated structures can be performed in a number of ways, such as with pick-and-place machinery and/or through the use of stencils. It will further be appreciated that in one embodiment, the singulated structures are secured to the lead frame carrier with an adhesive tape layer or the like that maintains the singulated structures in position for subsequent processing steps. In addition, aspects of the present disclosure can be applied to generate a wide range of lead frame configurations.

In process step 120, semiconductor dies are attached to the die attach pads of each lead frame in an otherwise conventional approach. The semiconductor dies are then wirebonded to the leads of each respective lead frame in process step 122. A molding structure is then formed over at least portions of the dies, die pads, leads etc. in process step 124. After the molding structure is formed, the molding structure is separated from the lead frame carrier and singulated (such as by sawing, for example) in process step 126 to generate individual semiconductor packages.

Figure 2:
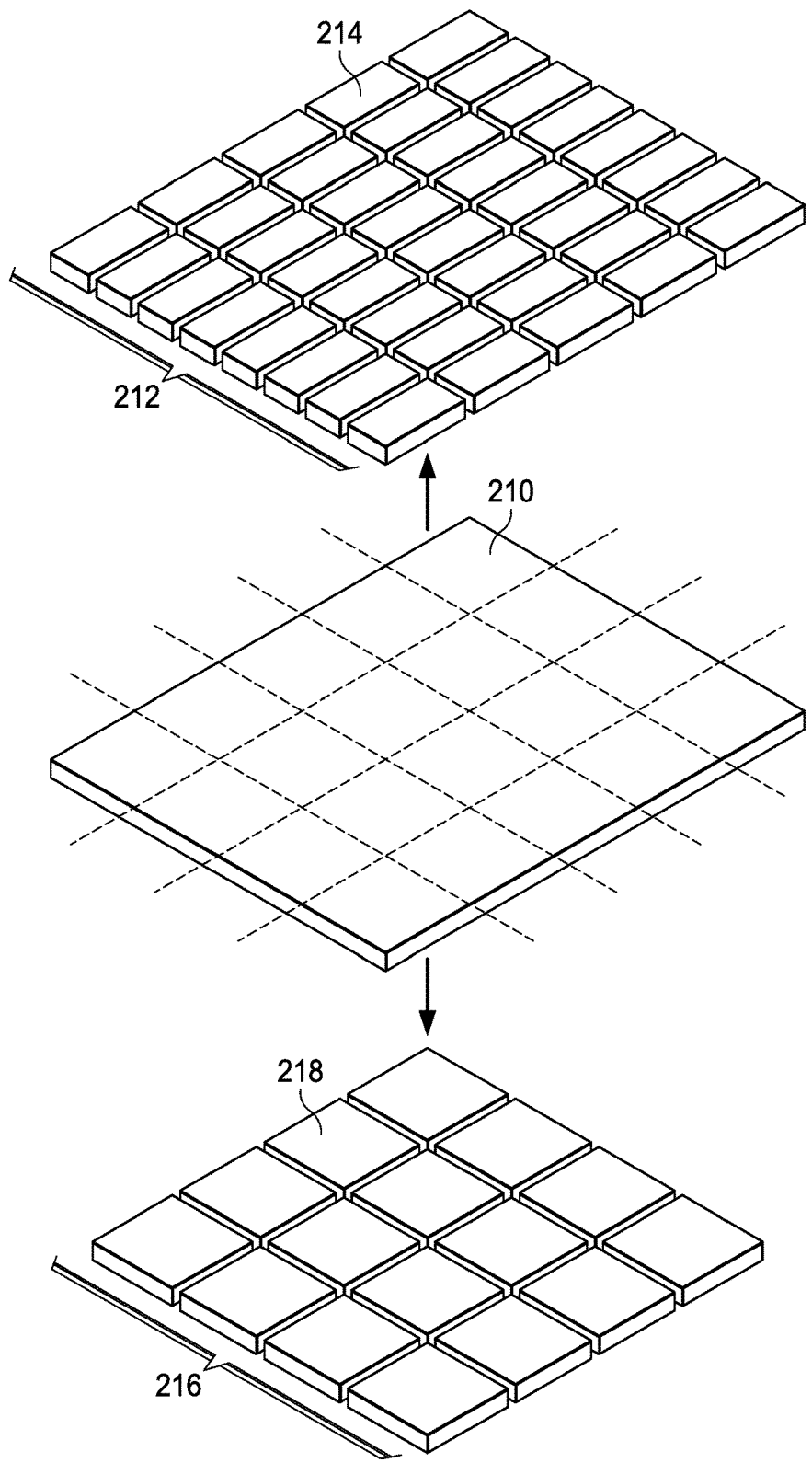
FIG. 2 is a perspective view of a plurality of die attach pads and leads singulated from a sheet of material in accordance with the method of FIG. 1.

Turning to FIG. 2, an example sheet of material 210 is illustrated. The sheet 210 can be a sheet of conductive material such as copper or the like. As noted above in connection with process step 114, the sheet 210 can have various plating layers formed thereon and/or can be roughened or otherwise processed (e.g., chemical surface treatment) to enhance mold adhesion in later processing steps. In accordance with process step 116, the sheet 210 can be separated into a plurality of individual structures, such as a plurality of leads 212 (individual leads identified by reference numeral 214) and/or a plurality of die attach pads 216 (individual die attach pads identified by reference numeral 218). In some embodiments, the leads 214 and die attach pads 218 can be made of a common material and/or singulated from a common sheet of material. In other embodiments, the leads 214 and die attach pads 218 can be made of different materials and/or singulated from different sheets of material. In either case, once singulated from a sheet of material, the individual structures in the illustrated example comprise preformed die attach pads and/or preformed leads.

Figure 3:
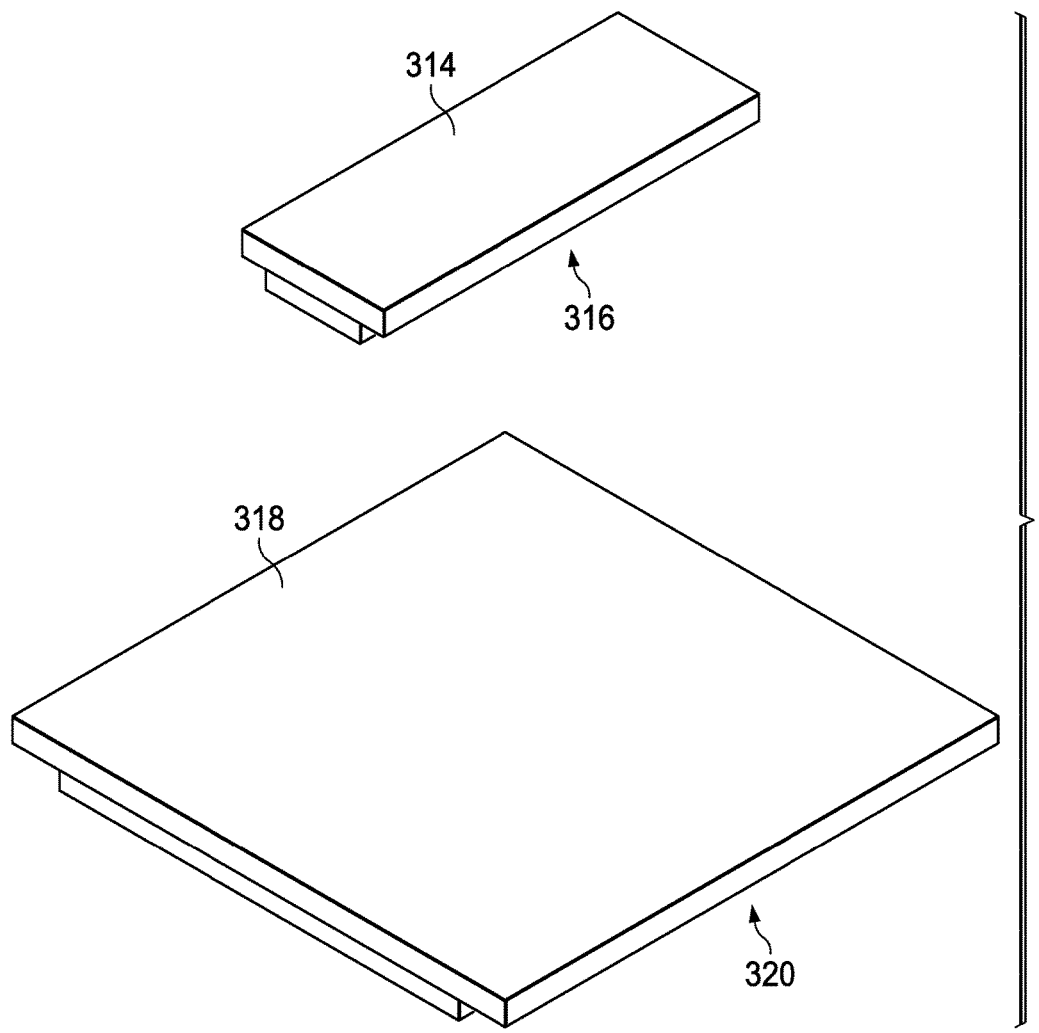
FIG. 3 is a perspective view of an example lead and die attach pad having a mold-lock feature formed during a singulation step of the method of FIG. 1.

With reference to FIG. 3, it will be appreciated that certain mold-lock features can be formed in the singulated structures during the singulation process. In one embodiment, the mold-lock features can include a lead 314 or die attach pad 318 with one or more stepped edges 316 and 320, respectively. The stepped edges provide additional structure and/or surface contour for integration of the preformed lead and/or die-attach pad with the molding structure. To this end, during singulation of the individual structures from the sheet(s) of material, extra material can be removed from the edge regions of the structures before, during or after separation from the sheet of material. In one embodiment, a trench is formed at least partially through the sheet of material and the individual structure is separated from the sheet of material in a location within the trench. This approach produces the stepped edge profile shown on the lead 314 and die 318 in FIG. 3. Other edge shape profiles are also possible, such as beveled or dovetailed, for example. As noted above, regardless of the manner in which the preformed leads and/or die attach pads are formed and/or otherwise obtained, the structures are arranged on a lead frame carrier in a predetermined configuration to form lead frames, each having a die attach pad and a plurality of leads spaced apart from the die attach pad and each other.

Figure 4:
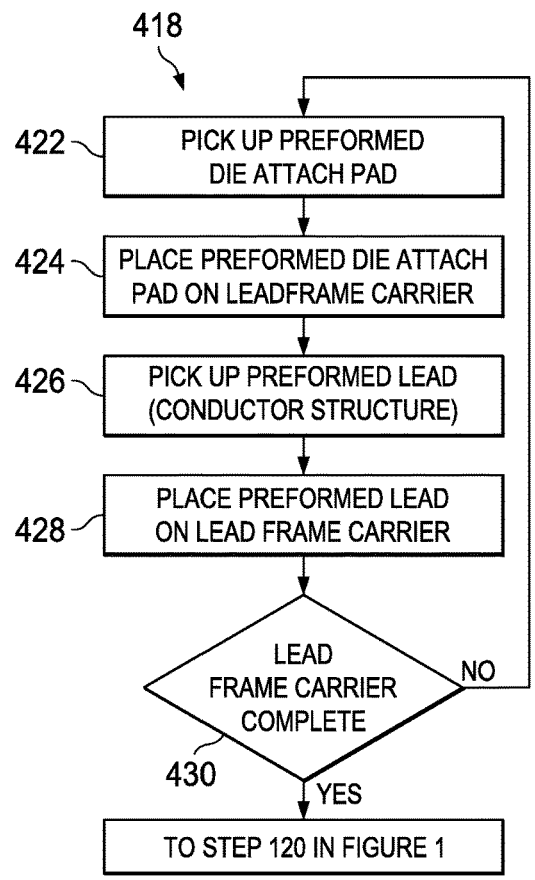
FIG. 4 is a flow diagram illustrating one example alternative for arranging preformed structures on a lead frame carrier in the arranging step of the method of FIG. 1.
Figure 5:
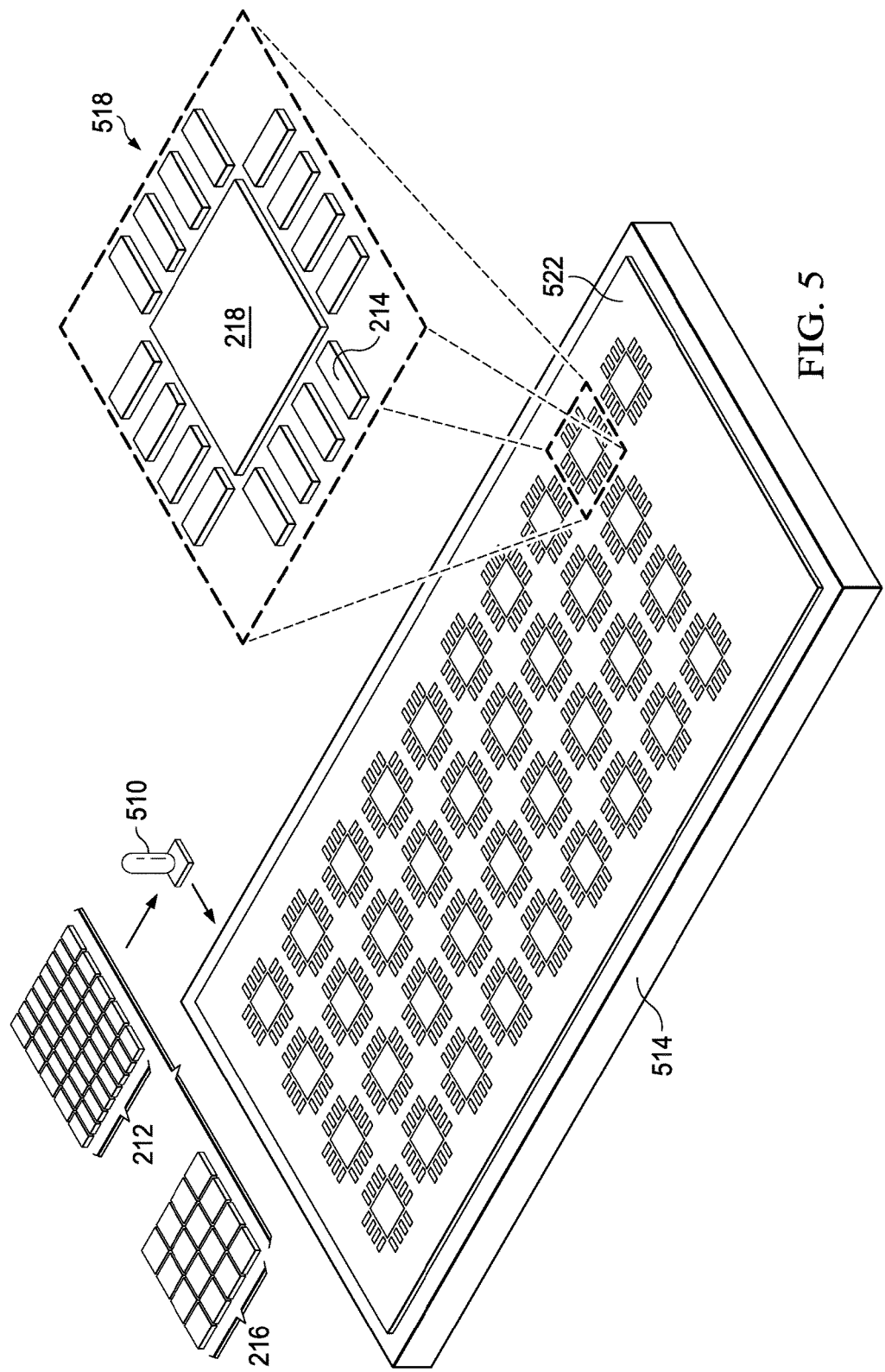
FIG. 5 is a perspective view of the implementation of the example method of FIG. 4.

Referring back to FIG. 1, and with further reference to FIGS. 4 and 5, process step 118 is the step wherein the singulated structures are arranged or otherwise placed on a lead frame carrier in a predetermined configuration to generate a plurality of lead frames. FIG. 4 illustrates one example method 418 of carrying out process step 118 using pick-and-place machinery for arranging the singulated structures on a lead frame carrier.

Method 418 includes process steps 422 and 424 wherein a preformed die attach pad is picked up and then placed on the lead frame carrier. In process steps 426 and 428, a lead is picked up and placed on the lead frame carrier. The method 418 continues to decision box 430, whereat the method reverts to process step 422 until the lead frame carrier is complete (e.g., all lead frames have been formed), at which time the method 418 continues to process step 120 in FIG. 1. Thus, method 418 can include picking and placing multiple die attach pads on the lead frame carrier, and picking and placing a plurality of preformed leads in proximity to each die attach pad to thereby form a plurality of lead frames on the lead frame carrier.

In one example, each lead frame is assembled in full before the next lead frame is assembled. In another example, several or all of the die attach pads are picked and placed on the lead frame carrier and, subsequently, the preformed leads are then picked and placed in proximity to each die attach pad to complete each of the lead frames. In still other examples, the preformed leads for some or all of the lead frames are picked and placed on the lead frame carrier and then the die attach pads are picked and placed to complete the lead frames. Of course, any suitable sequence of picking and placing the die attach pads and leads can be used.

FIG. 5 illustrates an example arrangement wherein a pick-and-place machine 510 is used to arrange the plurality of leads 212 and plurality of die attach pads 216 in a predetermined configuration on lead frame carrier 514 to form a plurality of lead frames 518. It should be appreciated that a tape or other layer 522 is provided for temporarily securing the leads 214 and die attach pads 218 to the lead frame carrier 514 after being positioned thereon.

Figure 6:
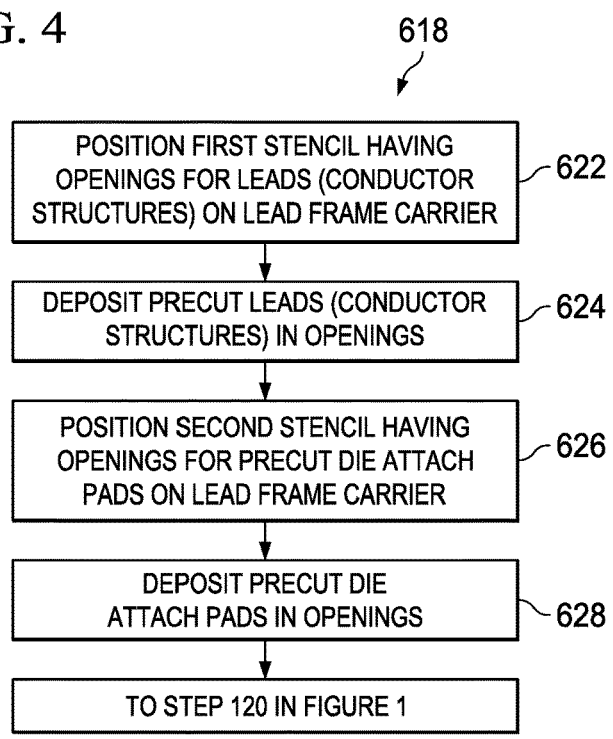
FIG. 6 is a flow diagram illustrating another example alternative for arranging preformed structures on a lead frame carrier in the arranging step of FIG. 1.
Figure 7:
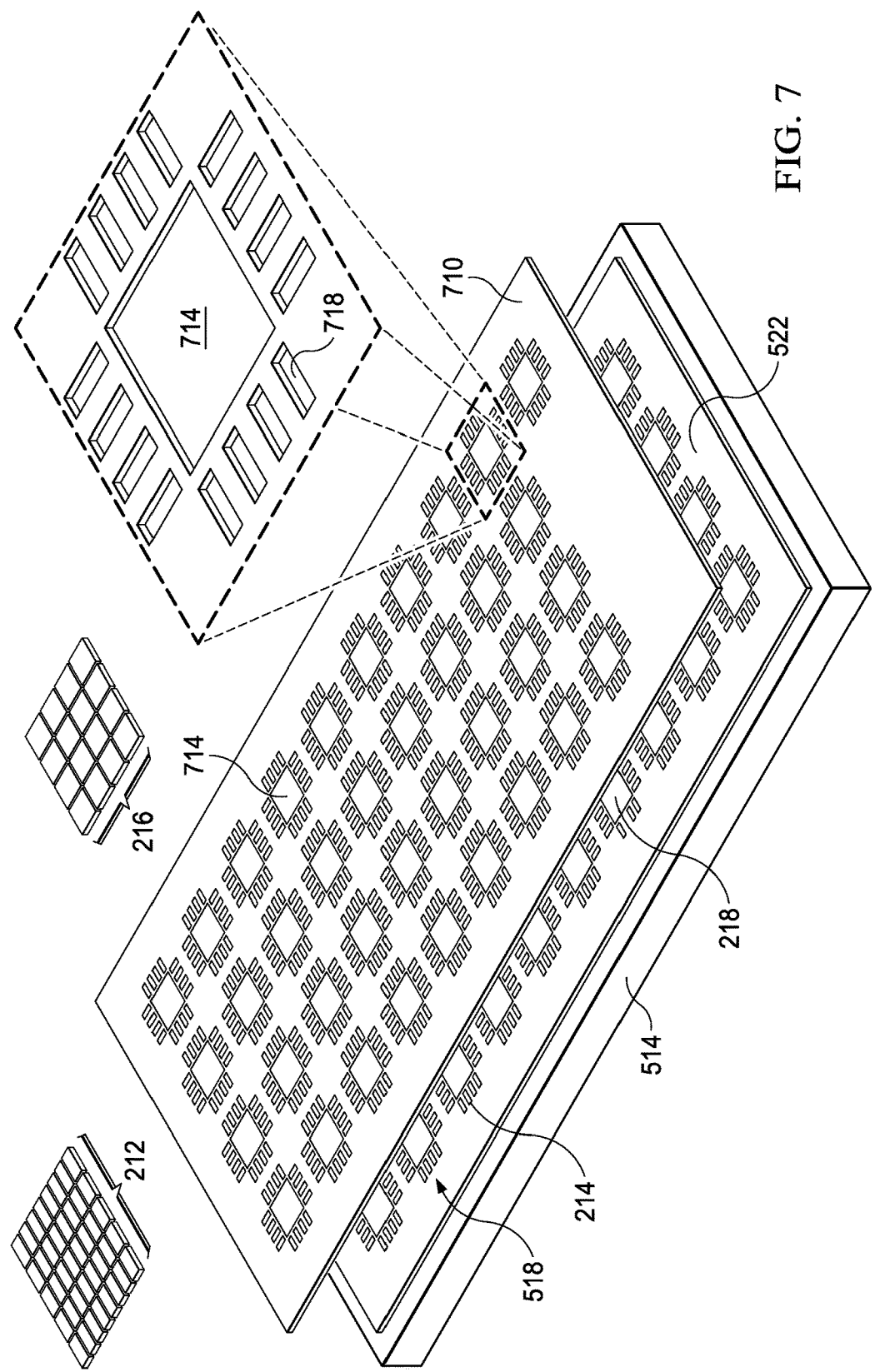
FIG. 7 a perspective view of the implementation of the example method of FIG. 6.

Turning to FIGS. 6 and 7, another example method 618 for carrying out process step 118 of FIG. 1 is illustrated. In this method, two stencils are used in succession for positioning the individual structures of each lead frame on the lead frame substrate. Accordingly, in process step 622 a first stencil is positioned on the lead frame carrier. In process step 624, the preformed leads (or die attach pads, as the case may be) are deposited onto the lead frame carrier through the openings in the first stencil.

In process step 626, a second stencil is positioned on the lead frame carrier. In process step 628, the preformed die attach pads (or leads, as the case may be) are deposited onto the lead frame carrier through the openings in the second stencil in the same manner as described above. Then, the method 618 reverts to process step 120 of FIG. 1.

FIG. 7 schematically illustrates an alternative embodiment of process 618 where only one stencil 710 is illustrated. Stencil 710 includes a plurality of first openings 714 for receiving die attach pads 218 and a plurality of second openings 718 for receiving leads 214. It will be appreciated that the die attach pads 218 and leads 214 can be guided into the respective openings in the stencil or stencils using any suitable method, such as vibration or the like, for example.

Figure 8:
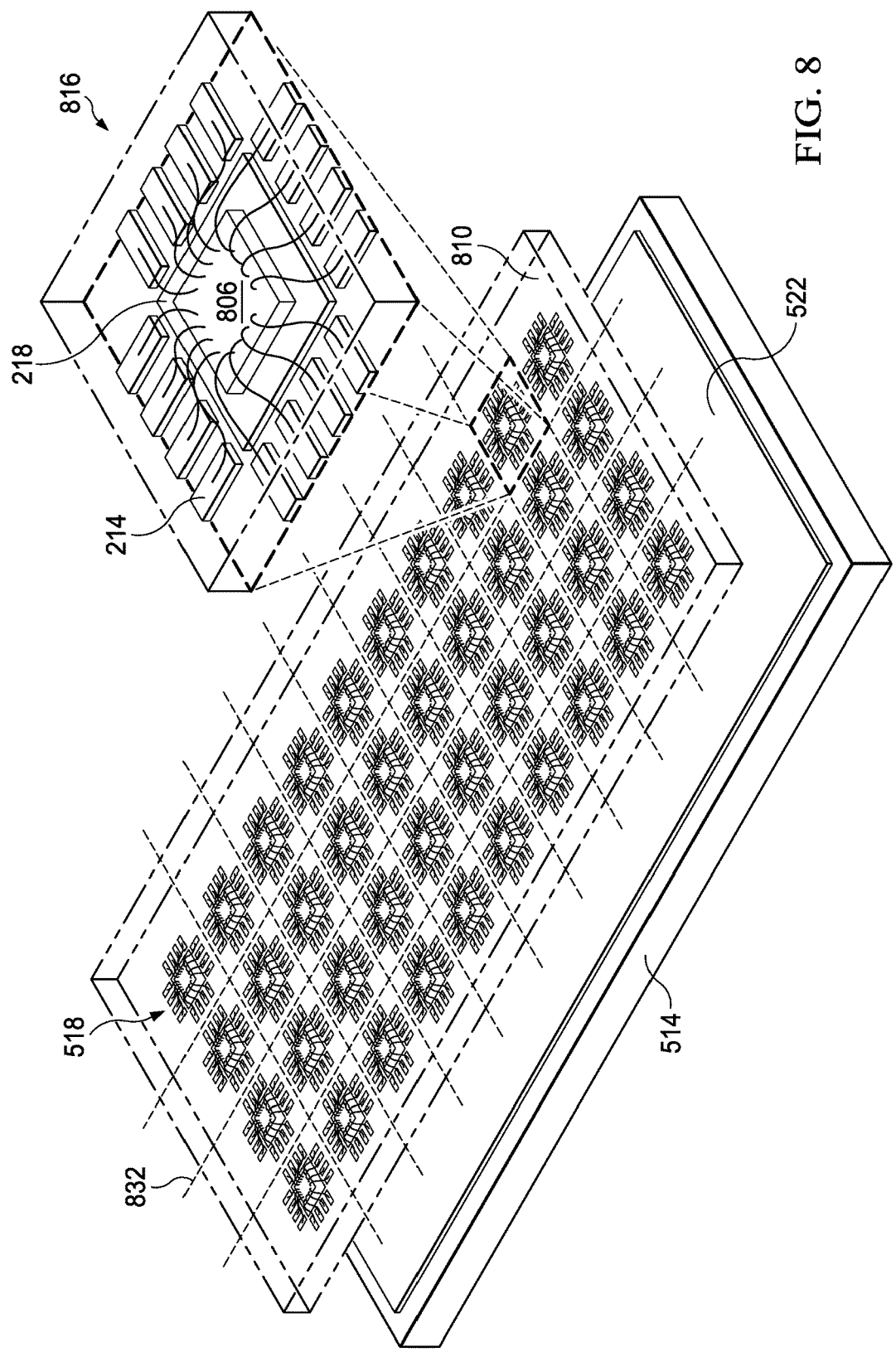
FIG. 8 is a perspective view illustrating the singulation of a die package with lead frame from a molded strip of die packages in accordance with the present disclosure.

Turning to FIG. 8, the lead frame carrier 514 with a plurality of lead frames 518 is illustrated after process steps 120, 122, and 124 of FIG. 1. As such, each lead frame 518 has a die 806 attached to its respective die attach pad 218 and wirebonded to leads 214. A molding structure 810 has been formed over the assemblies. As will be appreciated, the final step to forming a die package 816 is singulation of each die package from the molded strip of die packages. To this end, tape 522 is peeled off both the lead frame carrier 514 and the molded structure 810 thereby separating the molded structure 810 from the carrier 514. The individual die packages are then singulated along singulation lines 832 into a plurality of individual die packages via sawing or any other suitable method.

It should be appreciated that aspects of the present disclosure not only facilitate closer lead spacing than generally achievable using etching or stamping processes, but can also facilitate producing lead frames having a relatively higher power capacity by allowing for the use of die attach pads that are thicker than the leads. Thicker die attach pads can result in improved thermal characteristics for a given lead frame. Other lead frame construction approaches, for example etching approaches, have die attach pads and leads of the same thickness. In addition, etching processes have an upper limit to the thickness of the base material. The present disclosure can be used to produce lead frames having die attach pads of a wider range of thicknesses and of thicknesses different from that of the leads. Moreover, and as previously noted, different materials can be used for the die attach pads and the leads. All of these features result in a level of lead frame customization not generally available through prior approaches.

Aspects of the present disclosure are also well-suited to rapid production of new lead frame configurations. Unlike other approaches, the present disclosure does not require the production of any special tooling for producing new lead frame configurations. It will be appreciated that current pick-and-place machinery can be used to produce lead frames of a wide range of configurations without the need to first generate special tooling, such as stamping or etching tools. Current pick-and-place machine capabilities allow for placement at +/−10 microns and ratios less than about 2%. Of course, aspects of the present disclosure are applicable to pick-and-place methods of any accuracy. Similarly, the stencils referred to above can generally be produced more quickly than other specialized tooling that would otherwise be used. This allows new configurations of lead frames to be produced much more quickly than some other approaches.

It should also be appreciated that aspects of the present disclosure are well-suited to producing lead frames having a variety of configurations including, but not limited to: a split die attach pad (lead frame with multiple die attach pads and/or die attach pads of different respective materials), different base materials (lead frame with die attach pad of a material different than the leads), thicker die pad (lead frame having a die pad that is thicker than the leads), closely spaced leads (lead frame having leads with horizontal spacing less than one thickness of lead material), integrated passive components with smaller line/spacing (lead frame with passive components mounted adjacent chip on circuit board), fused lead (lead frame with two or more leads fused together), chip on lead (lead frame with chip mounted directly on leads), dual/multiple rows of leads (lead frame having two or more rows of leads, rows may have different heights or thicknesses), flip-chip on lead (lead frame having chip soldered to leads), non-conductive die attach pad (PCB and/or substrate with embedded chip).

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A method of making a leadframe comprising:
   singulating a plurality of conductor structures from a sheet of conductive material;
   forming a plurality of leads by arranging the plurality of singulated conductor structures on a lead frame carrier in a predetermined configuration; and
   arranging at least one die attach pad on the lead frame carrier to form at least one lead frame having the at least one die attach pad and the plurality of leads spaced apart from the at least one die attach pad, the at least one die attach pad having no protrusion of the conductive material from any corner.

2. The method of claim 1, wherein the arranging the plurality of singulated conductor structures on a lead frame carrier includes using a pick-and-place robot to position individual conductor structures on the lead frame carrier.

3. The method of claim 2, wherein the conductor structures include a first group of conductor structures having a first metal composition, size, shape or thickness and a second group of conductor structures having a second metal composition, size, shape, or thickness, and the arranging the plurality of singulated conductor structures on a lead frame carrier in a predetermined configuration to form at least one lead frame includes using at least one conductor structure from each group in the at least one lead frame.

4. The method of claim 1, wherein the arranging the plurality of singulated conductor structures on a lead frame carrier includes using a stencil, wherein the stencil includes openings in locations corresponding to the predetermined configuration, and wherein the stencil is applied over the lead frame carrier and the singulated conductor structures are placed on the lead frame carrier through the openings in the stencil.

5. The method of claim 4, wherein the conductor structures include the at least one die attach pad and at least one lead, the at least one die attach pad being larger than the at least one lead, the method further comprising using a first stencil for arranging the at least one die pad on the lead frame carrier and, subsequently, using a second stencil for arranging the at least one lead on the lead frame carrier.

6. The method of claim 1, further comprising securing the conductor structures to the lead frame carrier with an adhesive tape interposed between the conductor structures and the lead frame carrier.

7. The method of claim 1, wherein the singulating a plurality of conductor structures from a sheet of conductive material includes forming a mold-lock feature on the individual conductor structures.

8. The method of claim 7, wherein forming the mold-lock feature includes forming a stepped edge formed by forming a trench in the sheet of material having a first width, and severing the sheet of material at a position within the trench to generate the stepped edge.

9. A method of making a semiconductor die package comprising:
arranging at least one preformed die attach pad and at least two preformed leads on a lead frame carrier in a predetermined configuration to form a lead frame, the at least one preformed die attach pad having no protrusion from any corner;
attaching a semiconductor die to the at least one preformed die attach pad;
wire bonding the semiconductor die to the at least two preformed leads;
forming a molding structure including at least part of the semiconductor die and the at least two preformed leads;
removing the molding structure from the lead frame carrier.

10. The method of claim 9, wherein the preformed die attach pad includes a PCB.

11. The method of claim 9, wherein the at least two preformed leads include a first group of preformed leads in the form of conductor structures having a first metal composition, size, shape or thickness, and a second group of preformed leads in the form of conductor structures having a second metal composition, size, shape, or thickness, and wherein the arranging the at least two preformed leads on a lead frame carrier in a predetermined configuration to form a lead frame includes using at least one conductor structure from each group in the lead frame.

12. The method of claim 9, wherein the arranging at least one preformed die attach pad and at least two preformed leads on a lead frame carrier in a predetermined configuration to form a lead frame includes using a pick-and-place robot.

13. The method of claim 9, wherein the arranging the at least one preformed die attach pad and at least two preformed leads includes using a stencil, wherein the stencil includes openings in locations corresponding to the predetermined configuration, and wherein the stencil is applied over the lead frame carrier and the at least one preformed die attach pad and at least two preformed leads are placed on the lead frame carrier through the openings in the stencil.

14. The method of claim 13, wherein the at least one preformed die attach pad is larger in areal size than the at least two preformed leads, the method further comprising using a first stencil for arranging the at least one preformed die attach pad on the lead frame carrier and, subsequently, using a second stencil to arrange the at least two preformed leads on the lead frame carrier.

15. The method of claim 9, further comprising securing the at least one preformed die attach pad and at least two preformed leads to the lead frame carrier with an adhesive tape interposed therebetween.

16. The method of claim 9, further comprising forming at least one of the at least one preformed die attach pad and the at least two preformed leads by singulating a conductor structure from a sheet of conductive material.

17. The method of claim 9, further comprising wire bonding the semiconductor die to the at least two preformed leads, applying molding over at least a portion of the semiconductor die and lead frame, and removing the molded semiconductor die and lead frame from the lead frame carrier.

18. A method of making a semiconductor die package comprising:
singulating a plurality of conductor structures from one or more sheets of conductive material, the conductor structures including at least one die attach pad and at least one lead, the at least one die attach pad having no protrusion of the conductive material from any corner;
arranging the at least one die attach pad and the at least one lead on a lead frame carrier in a predetermined configuration to form at least one lead frame;
wire bonding a semiconductor die associated with the die attach pad to the at least one lead frame;
applying molding over the semiconductor die and at least one lead; and
removing the molded semiconductor die and lead frame from the lead frame carrier.

19. The method of claim 18, wherein the at least one die attach pad and at least one lead are singulated from sheets of different materials, whereby the at least one lead frame has a die attach pad that is a different material than at least one lead.

* * * * *